United States Patent

Brown et al.

[11] Patent Number: 5,987,043
[45] Date of Patent: Nov. 16, 1999

[54] LASER DIODE ARRAYS WITH OFFSET COMPONENTS

[75] Inventors: Dennis James Brown; Shantanu Gupta; David Pace Caffey, all of Tucson, Ariz.

[73] Assignee: Opto Power Corp., Tucson, Ariz.

[21] Appl. No.: 08/967,924

[22] Filed: Nov. 12, 1997

[51] Int. Cl.⁶ .............. H01S 3/04; H01S 3/043; H01S 3/19
[52] U.S. Cl. ............... 372/36; 372/34; 372/50; 362/250; 347/238; 347/237
[58] Field of Search .............. 372/50, 34, 36; 362/250; 347/238, 237

[56] References Cited

U.S. PATENT DOCUMENTS

| | | | |
|---|---|---|---|
| 3,760,175 | 9/1973 | Gibson et al. | 362/553 |
| 5,311,536 | 5/1994 | Paoli et al. | 372/50 |
| 5,337,074 | 8/1994 | Thornton | 346/107 R |
| 5,519,596 | 5/1996 | Woolverton | 362/250 |
| 5,521,931 | 5/1996 | Biegelsen et al. | 372/36 |
| 5,576,752 | 11/1996 | Kovacs et al. | 347/238 |
| 5,631,918 | 5/1997 | Kovacs et al. | 372/36 |

Primary Examiner—James W. Davie
Assistant Examiner—Sung T. Kim
Attorney, Agent, or Firm—Herbert M. Shapiro

[57] ABSTRACT

An array of laser diodes, or laser diode bars, is formed by positioning adjacent diodes or bars in an offset or staircase arrangement where the emitting facets of adjacent diodes, or bars, are in different planes. The offset arrangement permits the light from adjacent facets to be separated a distance q much shorter than permitted by prior art stacking arrangements because thermal and mechanical constraints characteristic of prior art stacks, are relaxed considerably in the offset arrangement. Power densities of 2000 watts/cm² (cw) are achieved with spacings of 0.6 mm between adjacent laser bars, a ten fold increase in power density over in-plane (prior art) positioning of like components.

12 Claims, 5 Drawing Sheets

LASER DIODE ARRAYS WITH OFFSET COMPONENTS

FIELD OF THE INVENTION

This invention relates to the laser diode arrays and more particularly to stacks of laser diodes or laser diode bars.

BACKGROUND OF THEN INVENTION

Laser diode arrays and arrays of laser diode bars are commercially available. Such arrays are fabricated typically by mounting individual laser diodes onto the top surface of a heat sink such that the emitting facet of the laser directs coherent light typically through a microlens positioned to collimate that light.

When individual laser diodes are stacked, the heat sinks are separated by a layer of electrically insulating material having a thickness equal to that of the laser diode and the insulating layer as well as the top of the laser diode are covered by a layer of electrically conducting material to which the adjacent heat sink is connected. The individual laser diodes (components) are aligned with one another in the stack such that all the emitting facets are in a single plane which is the same plane occupied by the end faces of the heat sinks.

In such arrangements, adjacent components are placed as close together as possible. But the minimum spacing, q, between adjacent components (i.e. the laser diodes or the light beams emitted thereby) is determined by the thickness of the components and the heat dissipating capacity of the stack. The best available separation between adjacent components in the stack (or array), whether the components are individual laser diodes or laser diode bars, is 1.2 mm which is capable of producing a power density of 200 watts/sq cm (cw). A characteristic of prior art stacks is that q=p.

BRIEF DESCRIPTION OF THE INVENTION

In accordance with the principles of this invention, q, is no longer a function of p and in fact, the distance between adjacent laser diodes or laser diode bars of a stack, q, can be much smaller than the center to center spacing between the heat sinks. In one embodiment, this new relationship is achieved by mounting each laser diode or laser diode bar (component) on the end face of a heat sink rather than on the top face and by stacking the heat sinks so that the end faces are offset with respect to one another to form a staircase configuration. Each of the components is mounted (emitting facets directed outwards) on a step where the riser of each step need be no greater than the thickness of the component (i.e. 80 microns). Thus, the emitting facets of adjacent components of a stack and, thus, the light beams emitted thereby, are separated by a distance q equal to the height of a riser. A q of less than 0.6 mm (600 microns) can be achieved in this manner with a power density of, for example, more than 2000 watts/sq cm, a ten fold increase in power density using commercially available components which produced only 200 watts/sq. cm when stacked according to prior art principles. In another embodiment, the end faces of adjacent heat sinks are formed at an obtuse angle. In this embodiment, the heat sinks need not be offset and still the q between adjacent facets may be much smaller than p.

The minimum separation between adjacent components in the foregoing stack arrangements, is limited by the diameter of the microlens used to collimate the light from the emitting facets of the components, an optical problem. But 100 micron diameter microlenses are available. Consequently, the optical problem is much less of a constraint than the mechanical and thermal problems of prior art stacks. The positioning of adjacent components of a stack, in accordance with the principles of the invention, has converted the minimum separation between components from a thermal and mechanical problem to an optical problem.

DETAILED DESCRIPTION OF ILLUSTRATIVE EMBODIMENTS OF THIS INVENTION

Figure 1:
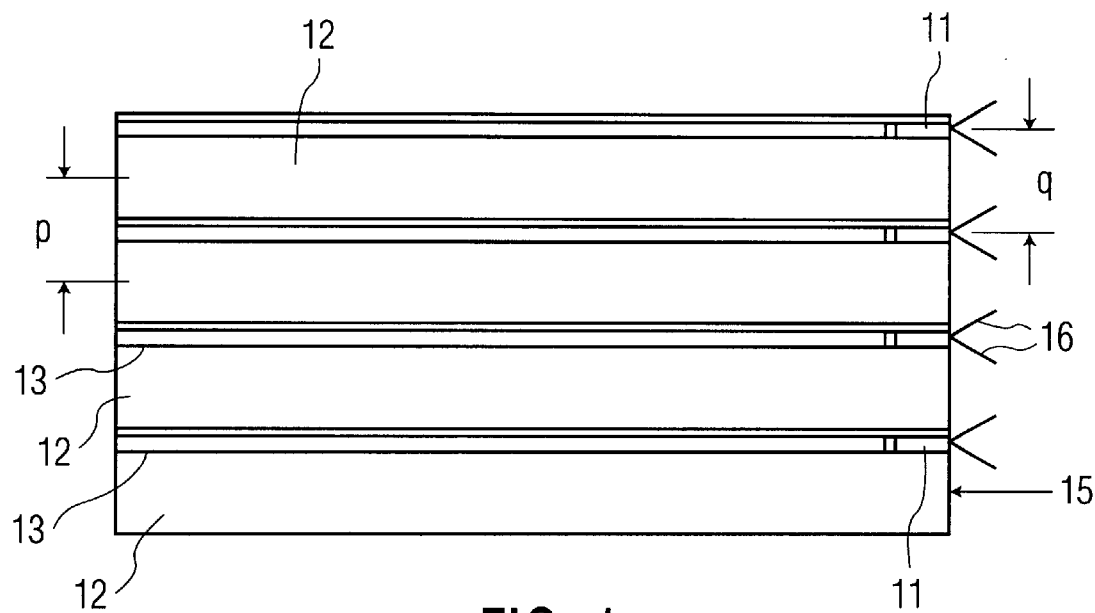
FIG. 1 is a schematic view of a prior art stack of components (laser diodes or laser diode bars) for forming a laser diode array.

FIG. 1 shows a prior art stack 10 of laser diodes or laser diode bars 11 mounted on respective heat sinks 12. A diode is mounted on the face 13 of each heat sink which faces the next adjacent heat sink in the stack. We will designate faces 13 as the top faces of the heat sinks. The laser diodes are mounted such that the emitting facets of the diodes direct light out of the plane of the ends 15 of the heat sinks as indicated by the diverging lines 16.

Figure 2:
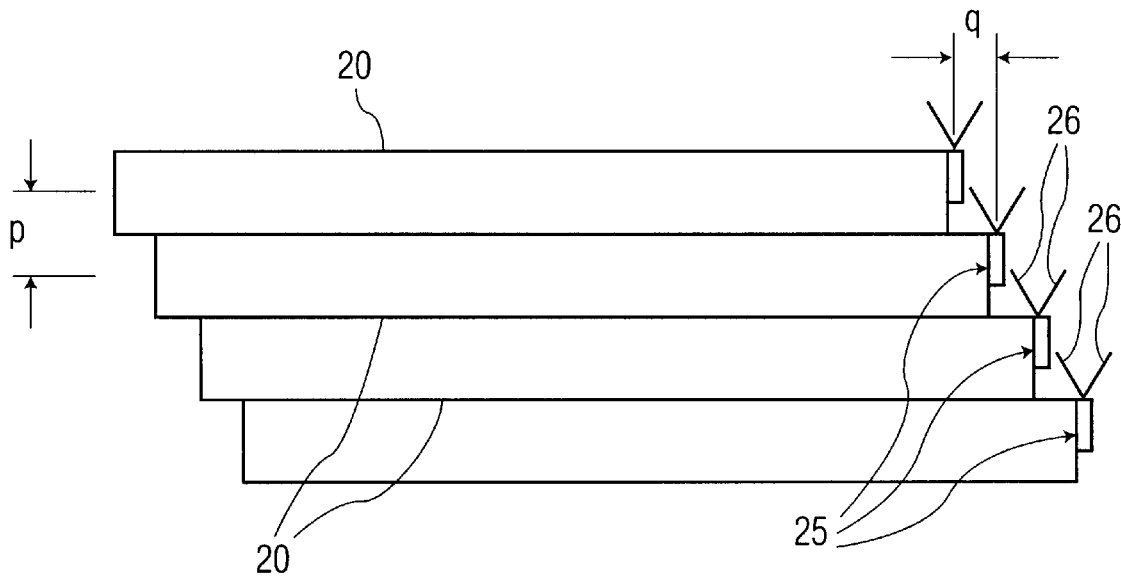
FIG. 2 is a schematic side view of a stack of components (laser diodes or laser diode arrays) where adjacent components are offset with respect to one another in a staircase configuration in accordance with the principles of this invention.

FIG. 2 shows a stack of laser diodes or laser diode bars with top faces 20 bonded to next adjacent heat sinks in the stack. But in accordance with the principles of this invention, the ends 25 of the heat sinks are offset from one another forming a staircase configuration. The laser diodes are mounted on the tread of each stair with the emitting facets directing light upwards as viewed in the figure and as represented by the diverging lines 26.

The advantages of the stack arrangement of FIG. 2 over the prior art stack arrangement of FIG. 1 is apparent from a comparison of the distance, q, between adjacent emitting facets, in each of the stacks, compared to the distance p, between the center lines of adjacent heat sinks in the respective stacks. In the prior art stack of FIG. 1, q hasp equal p as is clear from the figure.

In contradistinction, q is independent of p in the stack of FIG. 2 as is also clear from the figure. In FIG. 2, q is determined by the height of the riser of the step formed by the offset of the heat sinks.

Figure 3:
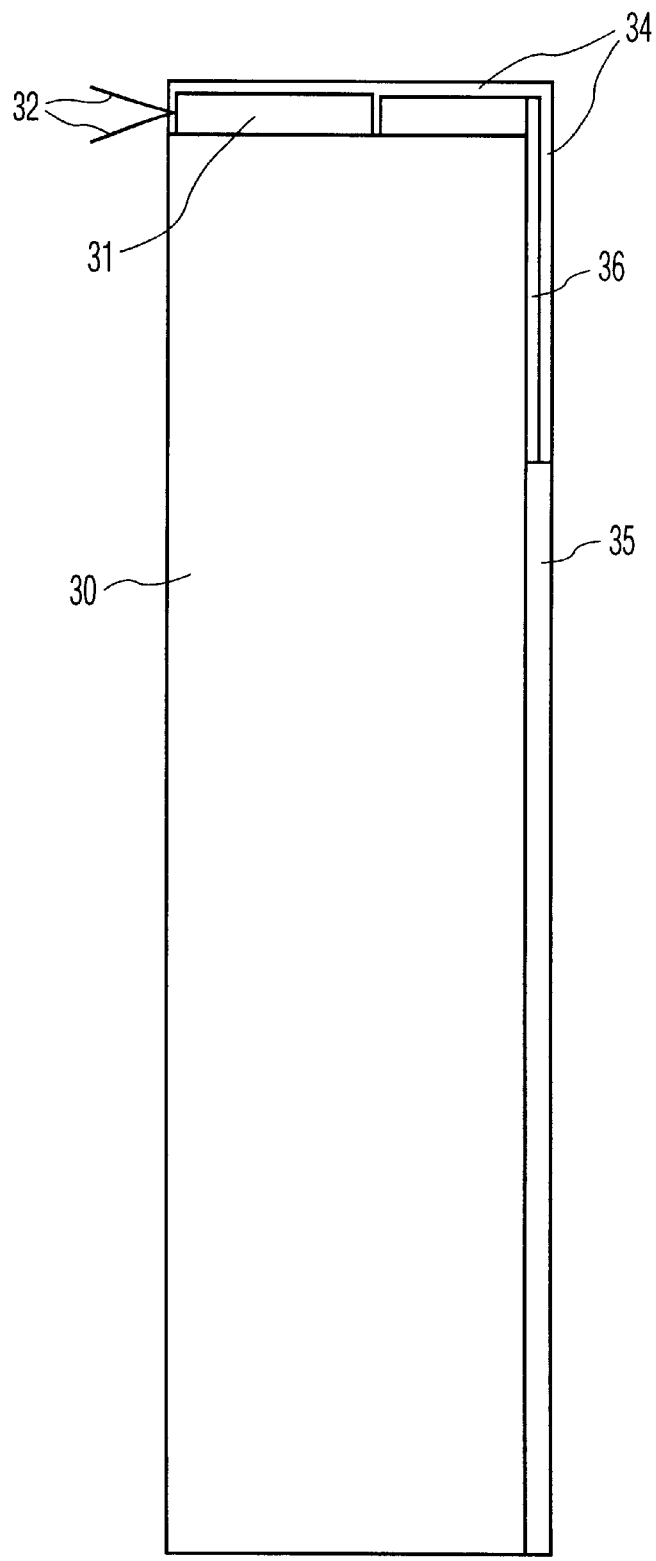
FIG. 3 is a schematic side view of a component of the stack of FIG. 2.

FIG. 3 shows an illustrative heat sink 30 of the stack of FIG. 2 with a laser diode (or laser diode bar) 31 mounted on the end of the heat sink. The emitting facet is directing light to the left, as indicated by diverging lines 32, as viewed in FIG. 3. The heat sink and diode have an electrical contact layer 34 and a gasket/spacing layer 35 coating an electrically insulating layer 36. FIG. 3 represents one unit of the stack of FIG. 2 with component 31 representing a single laser diode or a laser diode bar. The heat sink, conveniently, may be the heat sink disclosed in the U.S. patent application Ser. No. 08/638,545 filed Apr. 26, 1996 and assigned to the assignee of the present application.

Figure 4:
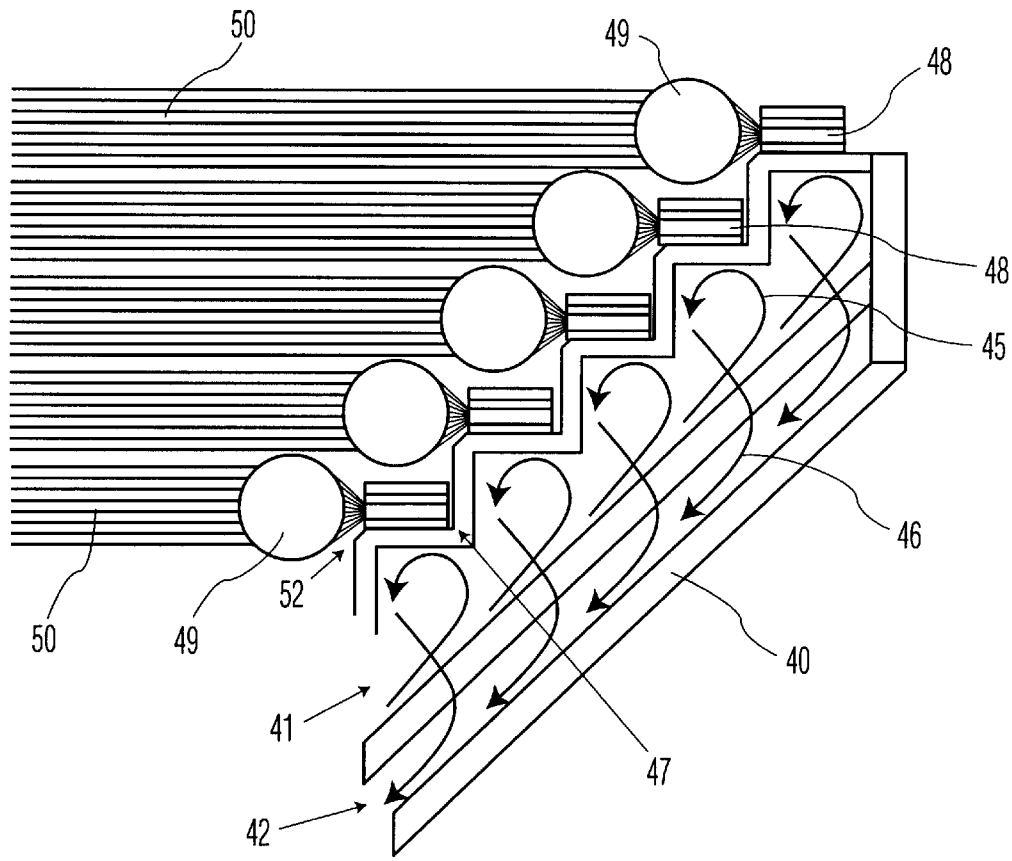
FIG. 4 is a schematic side view of the stack of FIG. 2.
Figure 5:
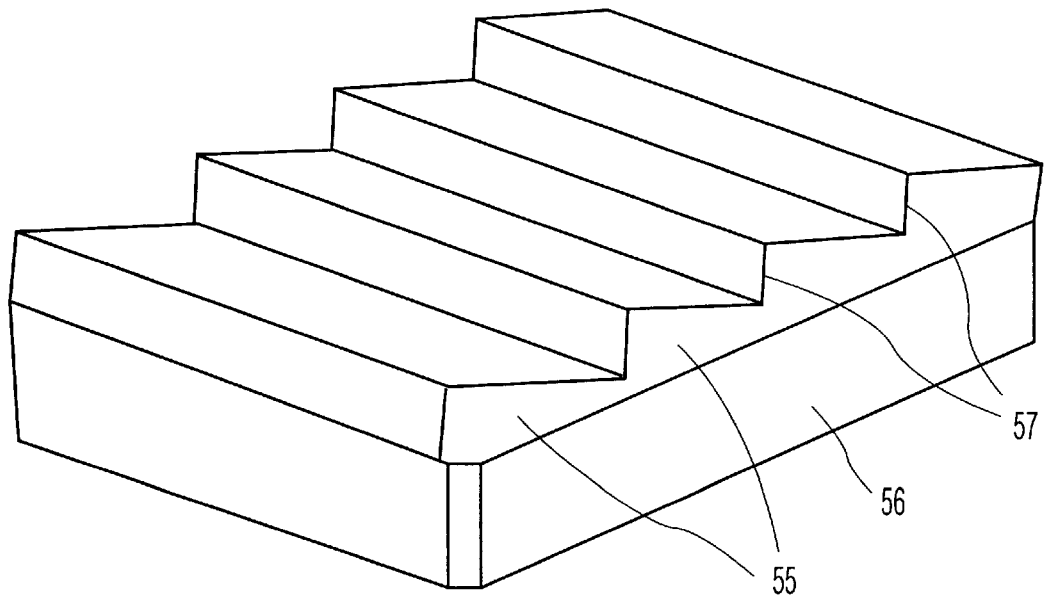
FIG. 5 is a projection view of an alternative embodiment of this invention.

FIG. 4 is a schematic side view of an embodiment of this invention employing a shared heat sink with a staircase-shaped face on the "treads" of which components (i.e. laser diodes) are mounted. Specifically, FIG. 4 shows a heat sink 40 with a coolant inlet manifold 41 and on output manifold 42. The coolant flow is indicated by curved arrows 45 and 46 for inlet and outlet paths respectively. The shared heat sink is a straight forward adaptation of the heat sink of the above-identified co-pending application except for the face 47 of the heat sink which forms the "staircase" characteristic of embodiments of the type shown in FIG. 2. FIG. 5 shows a projection view of an embodiment of the type represented in the side view of FIG. 4 and permits the embodiments to be visualized more easily.

Figure 6:
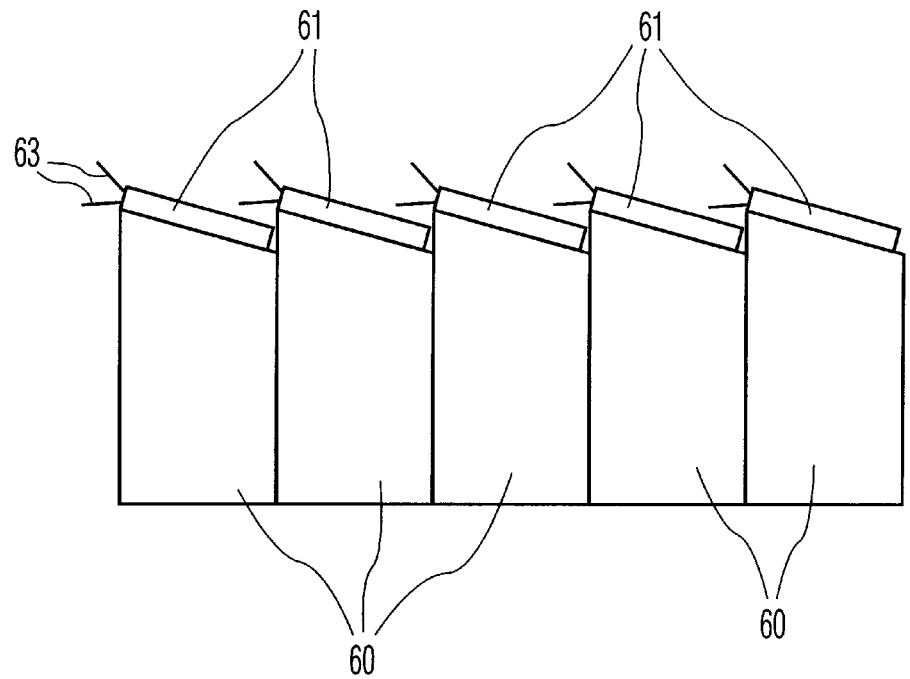
FIGS. 6, 7, 8 and 9 are schematic side views of alternative embodiments of this invention.
Figure 7:
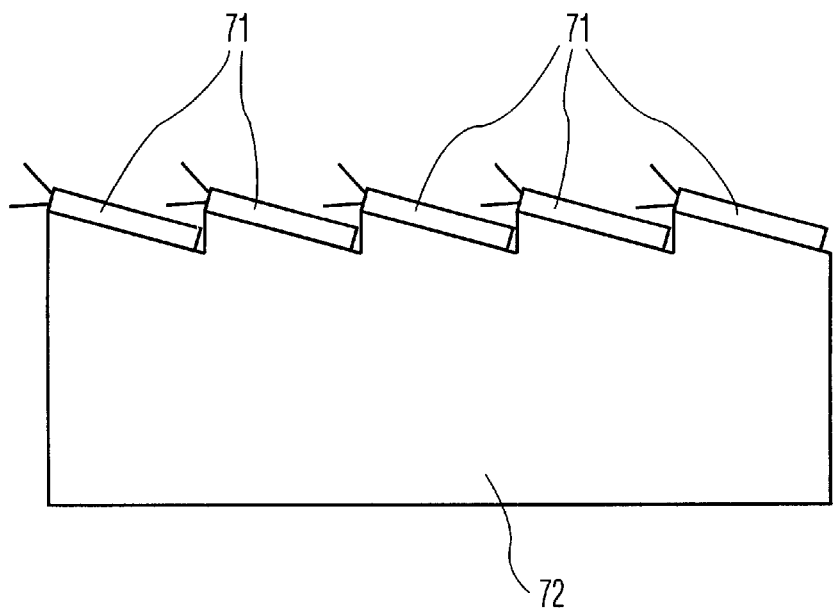

Laser diodes (components) 48 are bonded to the tread of each step of the staircase of FIG. 4, as shown in the figure, with microlenses 49 positioned to collimate light emitting from the emitting facets of the components as indicated by the parallel lines 50 Note that the knee 52 of each stair may be beveled, illustratively at a 45 degree angle to avoid any possible obstruction of emitted light. It is to be observed in FIG. 5, that the treads 55 of the shared heat sink 56 are not perpendicular to the risers 57 of the staircase. An angled tread configuration permits the alignment of adjacent heat sinks of a stack without any offset but still permitting a q much less than p for the stack. Such an arrangement is clear from FIG. 6. Specifically, FIG. 6 shows a stack of heat sinks 60 with angled tops, as viewed, laser diodes 61 are bonded to the tops of the heat sinks with emitting facets emitting light upwards and to the left, as viewed, as indicated by divergent lines 63. Stacks of the type shown in FIG. 6 can be constructed with a shared heat sink as represented in FIG. 7 with laser diodes 71 shown on the top "serrated" surface of shared heat sink 72.

Figure 8:
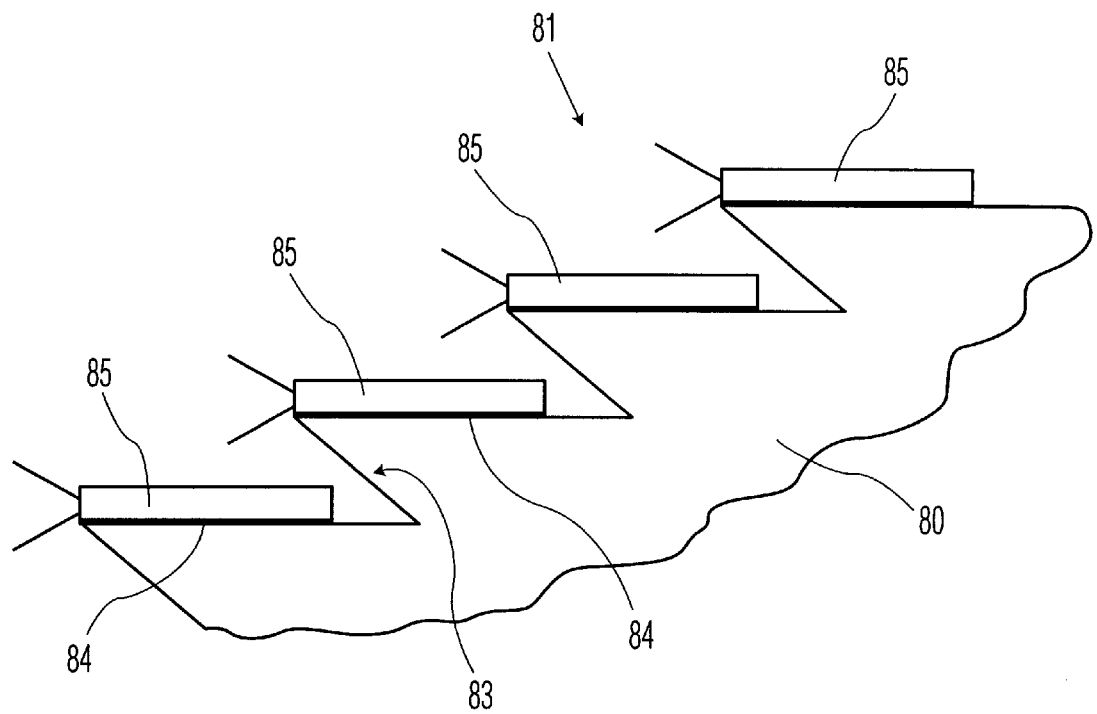

FIG. 8 shows a schematic side view of a shared heat sink 80 with a staircase shaped top surface 81 where the risers 83 are not perpendicular to the plane of the treads 84. In this type of embodiment, each tread protrudes forward from a position which it would occupy if the riser were perpendicular. Such a configuration allows each laser diode 85 to occupy a position overlapping the next lower laser diode as viewed in the figure. The result is that heat is more easily dissipated and emitted light from one diode is less likely to be obstructed by the adjacent laser diodes in embodiments where adjacent laser diodes are very closely spaced. For example, the distance between adjacent laser diodes can be made relatively small if the risers of the staircase are not perpendicular.

Figure 9:
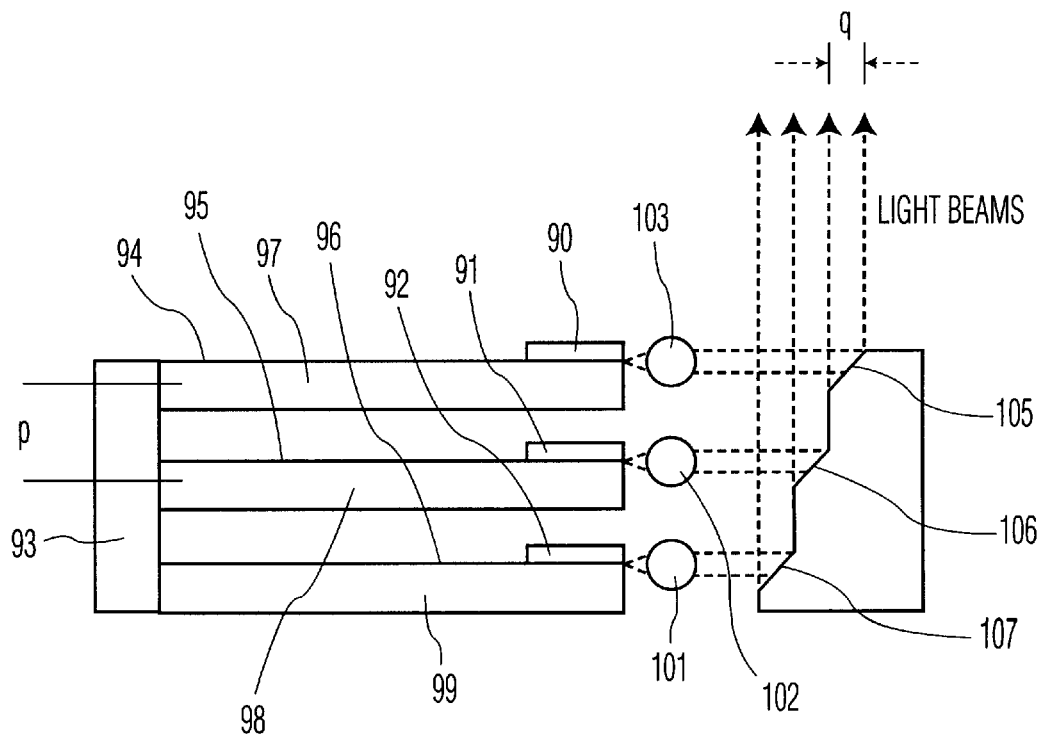

FIG. 9 illustrates an embodiment of this invention where the distance, q, between light beams form adjacent laser diodes or laser diode bars in a stack is much less than the distance, p. But in this embodiment the stack arrangement of the prior art type shown in FIG. 1.

Specifically, FIG. 9 shows, illustratively, those laser diodes 90, 91, and 92 with the laser diodes mounted on the top surfaces 94, 95, and 96 of heat sinks 97, 98, and 99; respectively. Light beams direct emitted light to the right as viewed. The light beams are collimated by microlenses 101, 102, and 103.

An arrangement of mirrored surfaces 105, 106, and 107 is positioned to reflect the beams from diodes 90, 91, and 92 respectively. The mirrored surfaces are conveniently formed on a glass block where the distance, q, between beams can be, for example, 0.2 mm compared to a distance, p, of, for example, 1.2 mm between centers of adjacent heat sinks.

It is clear then, that each embodiment herein provides a structure wherein the distance, q, between adjacent emitting facets of a stack of laser diodes or diode bars and thus between the beams emitted from those facets, is independent of the distance, p, between adjacent heat sinks, center to center, of the stack.

What is claimed is:

1. Apparatus comprising an array of laser diodes, each having an emitting facet for emitting a beam of coherent light, each of said laser diodes being bonded to a heat sink, said heat sinks being connected into an integral stack structure where the center to center distance (p) between adjacent heat sinks is greater than the distance, (q) between adjacent ones of said beams.

2. Apparatus as in claim 1 wherein each of said laser diodes is mounted on the end face of a heat sink and the heat sinks are stacked such that the end faces form a staircase configuration, each step of said staircase having a tread and a riser with a laser diode mounted on each of said treads with each of said risers determining the distance (q) between adjacent emitting facets.

3. Apparatus as in claim 1 wherein each of said laser diodes is mounted on the end face of a heat sink and the end face of each of said heat sinks forms an obtuse angle with respect to the side faces of said heat sinks, said heat sinks being stacked into an integral structure.

4. Apparatus as in claim 1 wherein each of said laser diodes comprises a laser diode of a laser diode bar.

5. Apparatus as in claim 1, comprising means for providing a mirrored surface for each of said emitting facets, each of said surfaces being positioned to reflect emitted light from one of said facets in a manner to reduce the distance between said beams.

6. Apparatus as in claim 5 including a collimating lens at each of said facets for directing collimated light into a corresponding one of said mirrored surfaces.

7. Apparatus as in claim 2 wherein said laser diodes are mounted on the end face of said heat sinks and said heat sinks are connected into an integral structure such that said end faces form a staircase configuration with the emitting facets of said laser diodes being spaced apart a distance equal to the riser of each step of said staircase.

8. Apparatus comprising an array of laser diodes, each of said laser diodes having an emitting facet, said apparatus including a heatsink structure with a staircase-shaped face having a plurality of stairs each with a tread and a visor for positioning said diodes such that each of said emitting facets is on a tread offset from the tread of an adjacent stair, adjacent ones of said emitting facets being positioned on adjacent ones of said treads such that the distance (9) between adjacent facets is smaller than the distance (p) between the center lines of adjacent ones of said stairs.

9. Apparatus as in claim 8 wherein each of said laser diodes comprises a laser diode of a laser diode bar.

10. Apparatus as in claim 8 also including a plurality of microlenses, said apparatus including means for positioning said microlenses in offset positions to collimate light emitted from an associated one of said emitting facets.

11. Apparatus as in claim 9 also including a plurality of microlenses, said apparatus including means for positioning said microlenses in offset positions to collimate light emitted form an associated one of said emitting facets.

12. Apparatus as in claim 8 wherein said heatsink structure comprises a plurality of heat sinks having first, second and third faces, a laser diode being mounted on a first surface of each of said heat sinks, an electrically-insulating layer coating said heat sinks, an electrically-conducting layer coating said electrically-insulating layer, said second surface of each of said heat sinks being bonded to the third surface of an adjacent heat sink in an offset position with respect thereto, each of said laser diodes having an emitting facet positioned to direct light in a direction of the plane of the third surface of the heat sink to which it is mounted.

* * * * *